United States Patent [19]

Sasaki et al.

[11] Patent Number: 5,360,745
[45] Date of Patent: Nov. 1, 1994

[54] THIN-FILM SOLAR CELL PRODUCTION METHOD

[75] Inventors: Hajime Sasaki; Hideo Naomoto, both of Itami, Japan

[73] Assignee: Mitsubishi Denki Kabushiki Kaisha, Tokyo, Japan

[21] Appl. No.: 2,808

[22] Filed: Jan. 11, 1993

[30] Foreign Application Priority Data

Sep. 8, 1992 [JP] Japan .................................. 4-266677

[51] Int. Cl.$^5$ .................. H01L 31/18; H01L 31/0392; H01L 31/0368
[52] U.S. Cl. ......................... 437/4; 136/258; 437/967; 437/233; 148/DIG. 54
[58] Field of Search ............ 136/258 PC, 261; 437/4, 437/106, 109, 233, 967; 148/DIG. 54

[56] References Cited

U.S. PATENT DOCUMENTS

| | | | |
|---|---|---|---|
| 4,003,770 | 1/1977 | Janowiecki et al. | 437/4 |
| 4,431,599 | 2/1984 | Lindmayer | 264/85 |
| 4,449,286 | 5/1984 | Dahlberg | 437/225 |

FOREIGN PATENT DOCUMENTS

| | | |
|---|---|---|
| 0039417 | 11/1981 | European Pat. Off. . |
| 2713287 | 9/1978 | Germany . |
| 1-231315 | 9/1989 | Japan . |
| 1-279747 | 11/1989 | Japan . |
| 2-185021 | 7/1990 | Japan . |
| 4-84467 | 3/1992 | Japan . |

OTHER PUBLICATIONS

M. Akani et al, *Thin Solid Films*, vol. 151, pp. 343–353, Aug. 1987.
T. Warabisako et al, *Jap. J. Appl. Phys.*, vol. 17 (1978), Supplement 17-1, pp. 309–314.
Okayasu et al, "Development of Poly-Crystalline Silicon Solar Cells Using Plasma-CVD Process", Technical Digest of the International PVSEC-5, Kyoto, Japan, 1990, pp. 911–914.
Chu et al, "Large Area Polycrystalline Silicon Solar Cells On Unidirectionally Solidified Acid-Treated Metallurgical Grade Silicon", IEEE Proceedings of Southeastcon '89, pp. 1437–1440.
"Photovoltaic Power Generation", edited by Overstraeten et al, Proceedings of the Second Contractors' Meeting, Sep. 1987, pp. 174–179.

*Primary Examiner*—Aaron Weisstuch
*Attorney, Agent, or Firm*—Voit & Mayer Leydig

[57] ABSTRACT

A thin-film solar cell includes a thin-film active layer with a p-n Junction and a heat-resistant substrate for mechanically supporting the active layer, which substrate is formed by a plasma coating method. In the plasma coating method, a source material of the substrate is melted with a high-temperature plasma and sprayed onto a base plate by a high-speed gas jet. Since the substrate formed by the plasma coating method is porous, even if an inexpensive material including a lot of impurities is used as a material of the substrate, the impurities are collected in pores of the substrate and never sprout out of the substrate breaking through the thin-film active layer.

8 Claims, 11 Drawing Sheets

THIN-FILM SOLAR CELL PRODUCTION METHOD

FIELD OF THE INVENTION

The present invention relates to a thin-film solar cell and a method of producing the thin-film solar cell using a heat resistant substrate. The invention also relates to a method of producing a semiconductor ingot and a method of producing a semiconductor substrate by a plasma coating method that includes melting a source material with a high-temperature plasma and spraying the melted source material onto a base substrate.

BACKGROUND OF THE INVENTION

Figure 15:
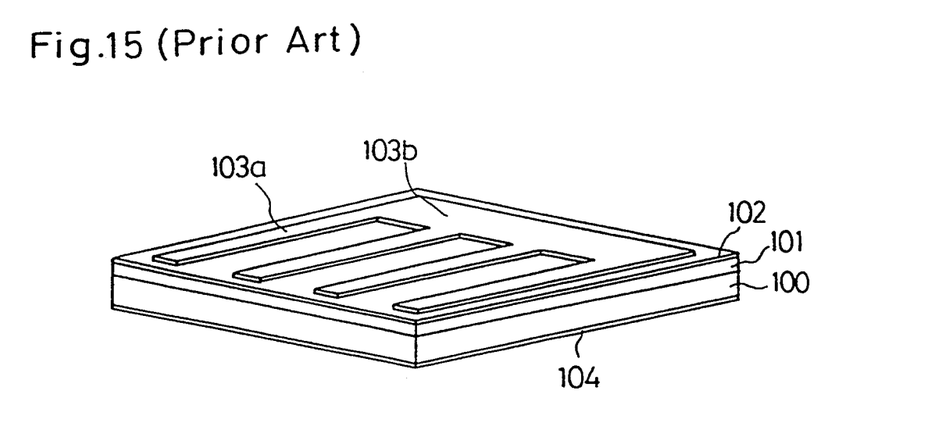
FIG. 15 is a perspective view for explaining a structure of a thin-film solar cell.

FIG. 15 is a perspective view of a prior art thin-film solar cell in which a light-to-electricity conversion is carried out in a thin silicon film disposed on a substrate. In FIG. 15, a thin-film active layer 101 including a p-n junction and contributing to power generation is disposed on a substrate 100. An anti-reflection film 102 is disposed on the active layer 101. A grid electrode 103a for collecting a photoelectric current generated in the active layer 101 and a bus electrode 103b for concentrating the photoelectric current are disposed on the anti-reflection film 102. A lower electrode 104 is disposed on the rear surface of the substrate 100.

In this thin-film solar cell, since the active layer 101 contributing to power generation is as thin as several tens of microns, it cannot mechanically support itself, so that a substrate or the like for supporting the thin active layer 101 is needed. The following conditions are required of the substrate.

First, the substrate should have a strength enough to mechanically support the thin film and itself. Second, since the Si thin-film active layer is grown on the substrate by thermal CVD or the like, the substrate should be refractory so that it can stand a process temperature of approximately 1000° C. during the growth of the active layer. Third, since the substrate also serves as a lower electrode, it should be electrically conductive. Even if the substrate is not conductive, a thin-film solar cell can be achieved. In this case, however, a conductive film must be disposed on the substrate or the lower electrode must be led out from the side surface of the solar cell in an integrated type solar cell, resulting in a complicated structure. Fourth, since the substrate itself does not contribute to power generation but only supports the active layer, it is desirable that the substrate is formed in a simple process using an inexpensive material.

As a material satisfying the above-described conditions, there is metallurgical grade silicon (hereinafter referred to as MG-Si). The MG-Si is a silicon material prior to being purified to make high purity silicon and includes a lot of impurities, i.e., an impurity concentration of about 2%. Since the MG-Si is not subjected to purification, it is much cheaper than high purity silicon.

Figures 16A, 16B:
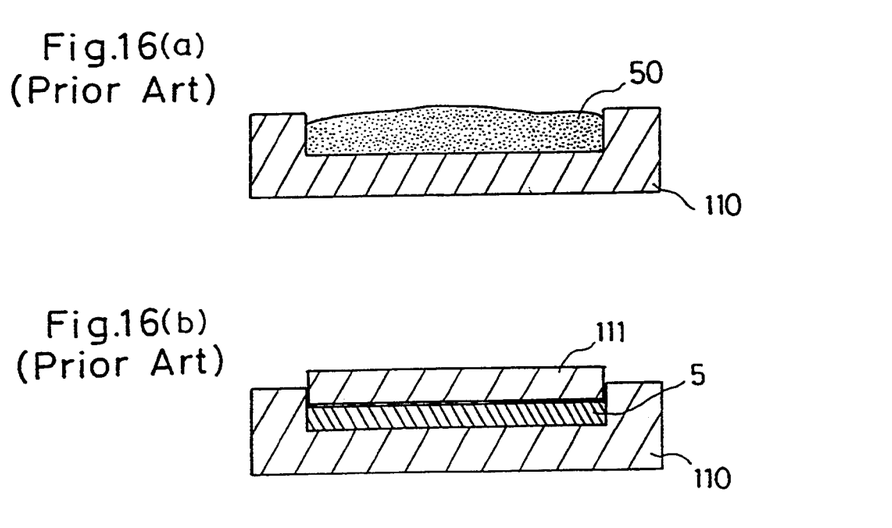
FIGS. 16(a) and 16(b) are sectional views illustrating a method of producing a substrate using MG-Si in accordance with the prior art.

FIGS. 16(a) and 16(b) are schematic diagrams illustrating a method of producing a heat-resistant supporting substrate of a thin-film solar cell using the inexpensive MG-Si. As shown in FIG. 16(a), MG-Si powder 50 is put in a mold 110, and the mold is heated to a temperature higher than the melting point of silicon, i.e., 1414° C., to melt the MG-Si powder. Then, the MG-Si thus melted is pressed with a plate 111 as shown in FIG. 16(b) and, thereafter, it is cooled and solidified to manufacture a MG-Si substrate 5.

Figure 17:
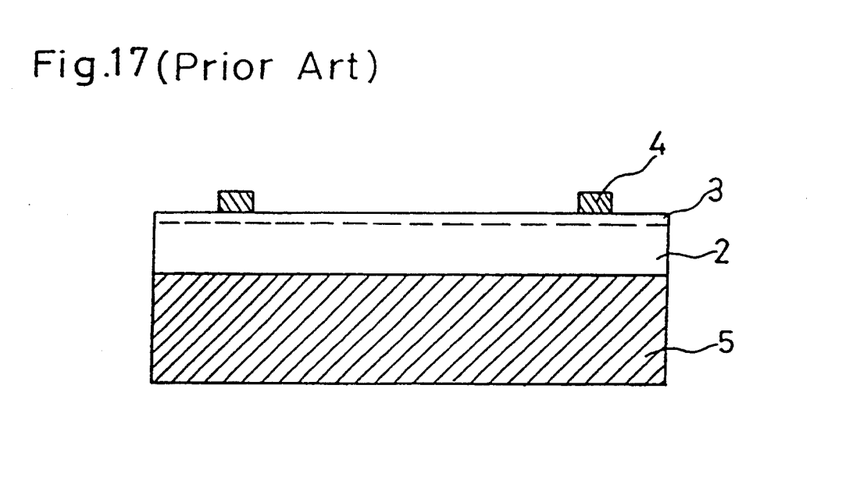
FIG. 17 is a sectional view of a thin-film solar cell in accordance with the prior art.

FIG. 17 is a cross-sectional view of a prior art thin-film solar cell including the MG-Si substrate 5 formed by molding. In FIG. 17, a polycrystalline Si thin-film active layer 2 is disposed on the MG-Si substrate 5. A p-n junction 3 is produced in the surface region of the active layer 2 by diffusion or the like. An upper electrode 4 is disposed on the active layer 2 having the p-n junction 3.

A description is now given of a method of producing the thin-film solar cell shown in FIG. 17 using the MG-Si substrate 5. Initially, the MG-Si substrate 5 is put in a CVD apparatus. Then, silane ($SiH_4$) gas, silane trichloride ($SiHCl_3$) gas, or the like is introduced into the apparatus and decomposed at a high temperature of about 1000° C., whereby a polycrystalline Si film to be the active layer 2 is grown on the substrate 5 to a thickness of several tens of microns. Since the Si thin film just after the growth has a small grain size, the polycrystalline Si may be, in some cases, melted and recrystallized by laser radiation or radiant heating to increase the grain size. After forming the Si film, the p-n junction 3 is produced in the active layer 2 by dopant impurity diffusion or ion implantation. The p-n junction may also be produced by changing the kind of dopant gas while introducing a dopant gas into a CVD apparatus to and growing the active layer in the apparatus. Alternatively, the p-n junction may be produced by depositing on the active layer a microcrystalline film having a conductivity type opposite the conductivity type of the active layer in a plasma CVD apparatus.

After forming the p-n junction, the upper electrode 4 comprising silver or the like is formed on the active layer 2. Preferably, the upper electrode 4 is formed by screen printing or vapor deposition. There are some cases where an anti-reflection film is formed on the polycrystalline Si thin film by sputtering or the like. As the anti-reflection film, a transparent conductive film also serving as an electrode, such as an ITO ($In_2O_3$:-$SnO_2$) film, a $SnO_2$ film, or a ZnO film, is used when the p-n junction is produced by depositing a microcrystalline film on the Si film and the conductivity of the Si film in the transverse direction is low. When the conductivity of the Si film in the transverse direction is high and the transparent electrode is not needed, an insulating film, such as a $Si_3N_4$ film, is used as the anti-reflection film.

In the above-described method of producing the thin-film solar cell using the molded MG-Si substrate 5, the MG-Si substrate is heated up to about 1000° C. when the polycrystalline Si thin film is grown and, thereafter, it is heated up to about 1414° C. when the grain size of the Si thin film is increased by radiant heating or the like. Therefore, impurities, such as Fe, Al, Ca and the like, included in approximately 2% in the MG-Si substrate 5 unfavorably concentrate and sprout out of the substrate thereby breaking through the active layer.

Figure 18:
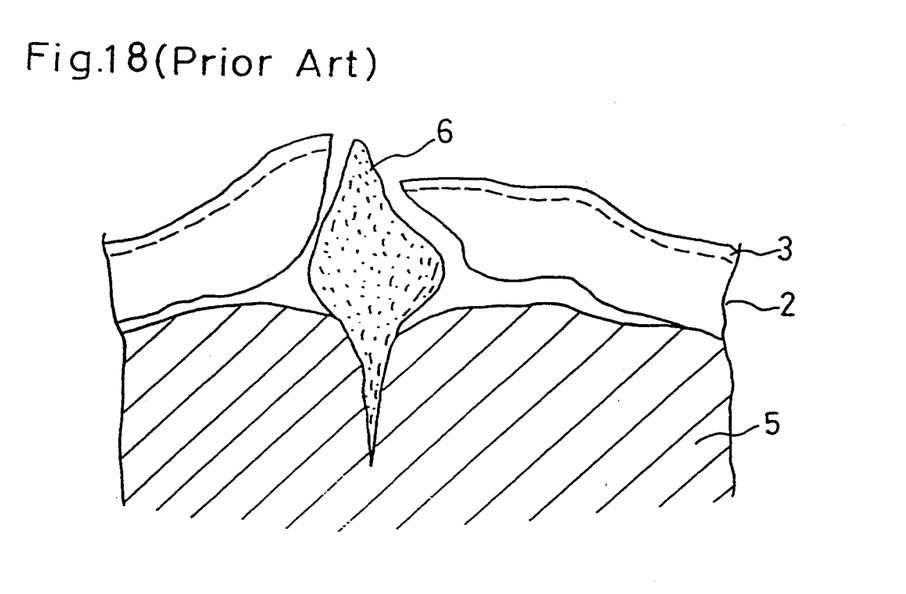
FIG. 18 is a sectional view illustrating a broken active layer due to impurities sprouting from the substrate in accordance with the prior art.

This phenomenon is illustrated in FIG. 18. In FIG. 18, reference numeral 5 designates the molded MG-Si substrate, numeral 2 designates the polycrystalline Si thin-film active layer, numeral 3 designates the p-n junction, and numeral 6 designates the sprouting impurities. As shown in FIG. 18, when heat is applied to the molded substrate 5, the impurities concentrate and sprout from a portion supposed to be a grain boundary of the MG-Si substrate, breaking through the active layer 2.

In addition, the p-n junction of the active layer is formed by impurity diffusion or ion implantation, or by changing the kind of the dopant gas during the growth of the active layer in a CVD apparatus, or by depositing a microcrystalline film having an opposite conductivity type from the conductivity type of the active layer on the active layer in a plasma CVD method. In all cases, the formation of the p-n junction takes a lot of time.

SUMMARY OF THE INVENTION

It is an object of the present invention to produce a highly-reliable thin-film solar cell in a simple process at a low cost.

It is another object of the present invention to reduce the time for forming an active layer or a p-n Junction.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a thin-film solar cell includes a heat-resistant supporting substrate formed by a plasma coating method that includes melting a source material of the substrate with a high-temperature plasma and spraying the melted source material onto a base plate or a mold by a high-speed gas jet. Therefore, even when an inexpensive material including a lot of impurities, such as MG-Si, is used as a material of the substrate, the impurities do not sprout out of the substrate breaking through a thin-film active layer during a high-temperature process, such as the formation of the active layer.

According to another aspect of the present invention, in a method of producing a thin-film solar cell, a semiconductor active layer having a p-n junction is formed by the plasma coating method. Therefore, the time for forming the active layer or the p-n junction is significantly reduced.

DETAILED DESCRIPTION OF THE PREFERRED EMBODIMENTS

Figure 1:
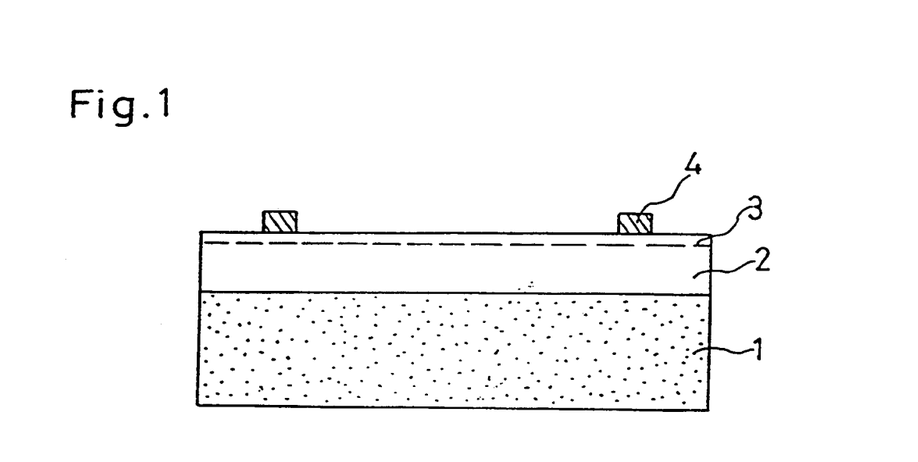
FIG. 1 is a sectional view of a thin-film solar cell in accordance with a first embodiment of the present invention.

FIG. 1 is a cross-sectional view illustrating a thin-film solar cell in accordance with a first embodiment of the present invention. In FIG. 1, reference numeral 1 designates a MG-Si substrate. A polycrystalline Si thin-film active layer 2 is disposed on the substrate 1, and a p-n junction 3 is produced in a surface region of the active layer 2 by diffusion or the like. An upper electrode 4 is disposed on the active layer 2 having the p-n junction 3.

The MG-Si substrate 1 according to the first embodiment is formed by a plasma coating method, that includes melting a powder with a high-temperature plasma and spraying the melted material power onto a target with a high-speed gas jet. The plasma coating method has conventionally been used in coating a refractory material, but it has never been used in producing a solar cell.

Figure 2:
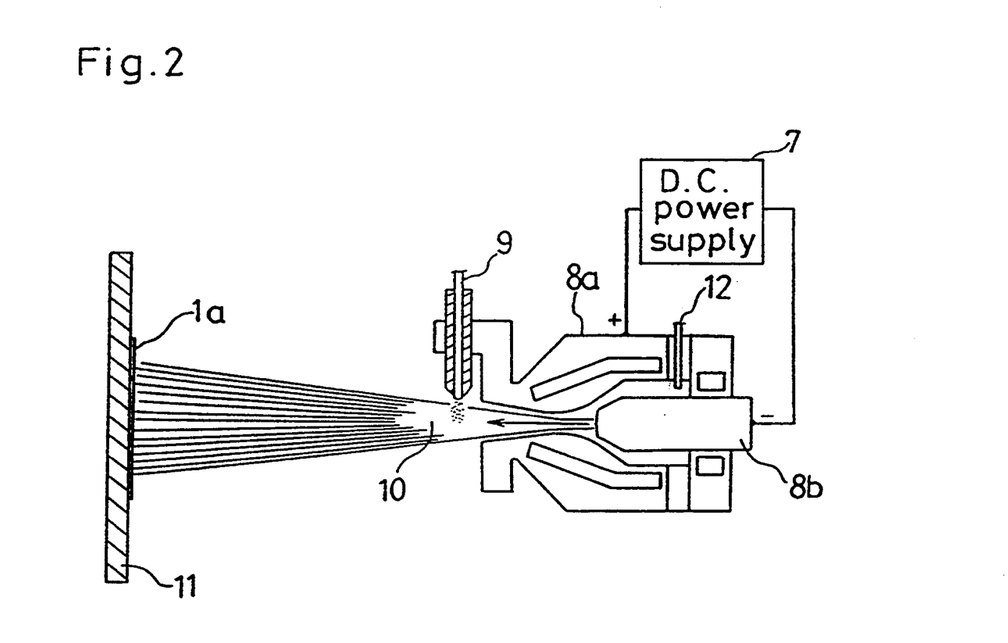
FIG. 2 is a diagram illustrating a method of producing a support substrate by a plasma coating method.

The plasma coating method will be described in more detail using FIG. 2. In FIG. 2, reference numeral 7 designates a DC power supply, numerals 8a and 8b designate electrodes, numeral 9 designates an inlet of a source material, numeral 10 designates a plasma Jet, numeral 11 designates a base plate, and numeral 12 designates a gas inlet through which a gas for generating the plasma jet 10 is introduced.

A description is given of a method of producing the MG-Si substrate 1 using the plasma coating apparatus shown in FIG. 2. A high voltage is applied across the electrodes 8a and 8b by the DC power supply 7 to generate an arc discharge between the electrodes 8a and 8b and, at the same time, argon (Ar) Gas or the like is introduced into the plasma coating apparatus from the gas inlet 12 with a high pressure, whereby the gas becomes a high-temperature plasma of tens of thousands ° C. due to the arc discharge and the plasma jet 10 is emitted from the electrodes to the outside. At this time, the MG-Si powder with a particle size of several tens of microns is injected into the plasma jet 10 through the inlet 9. The MG-Si powder is melted by the high-temperature plasma and sprayed onto the base substrate 11. The base plate 11 is cooled by a water-cooling or air-cooling apparatus (not shown), so that the molten MG-Si applied onto the base plate 11 is cooled and solidified. This process is repeated several times to produce a MG-Si substrate 1a. Thereafter, the substrate 1a is removed from the base plate 11, resulting in the self-supporting MG-Si substrate 1.

A description is now given of a method of producing the thin-film solar cell shown in FIG. 1. Initially, the MG-Si substrate 1a formed by the above-described plasma coating method is put in a CVD apparatus. Then, a source gas, such as $SiH_4$ or $SiHCl_3$, is introduced into the CVD apparatus and decomposed at a temperature as high as 1000° C., whereby a polycrystalline Si film to be an active layer 2 is grown on the substrate 1 to a thickness of several tens of microns. The Si thin film just after the growth has a small grain size and, in some cases, the polycrystalline Si is melted and recrystallized by laser radiation or radiant heating to increase the grain size. After forming the active layer 2, the p-n junction 3 is produced in the active layer 2 by dopant impurity diffusion or ion implantation. The p-n junction may be produced by changing the kind of dopant gas while introducing a dopant gas into the CVD apparatus and growing the active layer in the CVD apparatus. Alternatively, the p-n junction may be produced by depositing on the active layer a microcrystalline film having an opposite conductivity type to the conductivity type of the active layer in a plasma CVD apparatus.

After the formation of the p-n Junction, the upper electrode 4 comprising silver or the like is formed on the active layer 2. Preferably, the upper electrode 4 is formed by screen printing or vapor deposition. There are some cases where an anti-reflection film is formed on the polycrystalline Si thin film by sputtering or the like. As the anti-reflection film, a transparent conductive film also serving as an electrode, such as an ITO ($In_2O_3$:$SnO_2$) film, a $SnO_2$ film, a ZnO film, or an insulating film, such as a $Si_3N_4$ film, is used.

Figure 3:
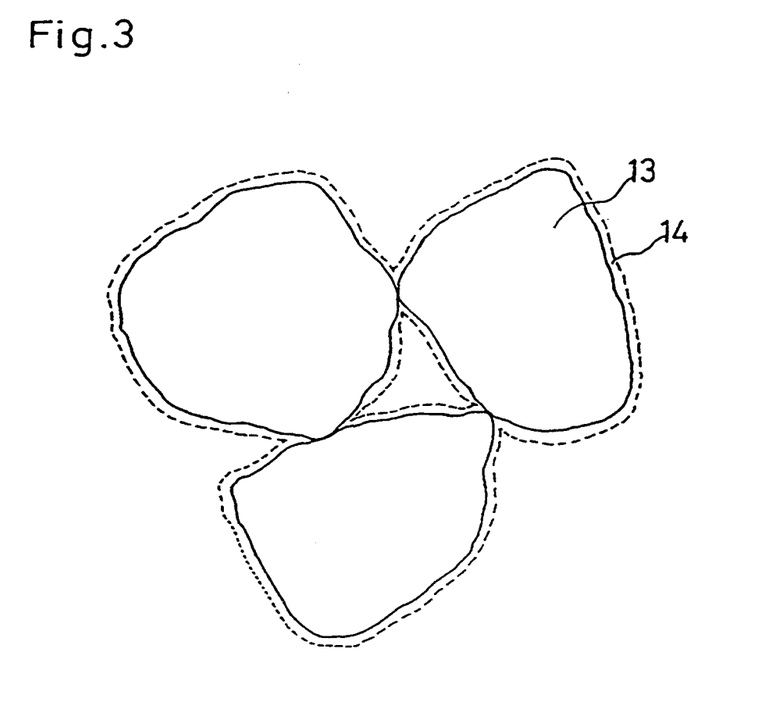
FIG. 3 is a diagram illustrating impurity separation in a substrate formed by the plasma coating method.

The substrate formed by plasma coating is more porous than the substrate formed by molding and includes innumerable pores. FIG. 3 is an enlarged view of grains of the substrate formed by plasma coating. In FIG. 3, reference numeral 13 designates an MG-Si grain having a diameter of several microns to 100 microns, and numeral 14 designates impurities separated from the grains. When this substrate is subjected to a high-temperature processing, impurities included in the substrate do not sprout out of the substrate. This is because the impurities 14 are separated out of each MG-Si grain 13 and collect on the surface of the grain, i.e., the impurities 14 are evenly collected in the pores, i.e., the spaces between the grains 13. Therefore, there is no destruction of the active layer due to the separation of impurities in the subsequent processing.

Although MG-Si is used as the source material in the above-described first embodiment, any material may be used so long as it is electrically conductive and has the heat-resisting property required for a heat-resistant supporting substrate.

Figure 4:
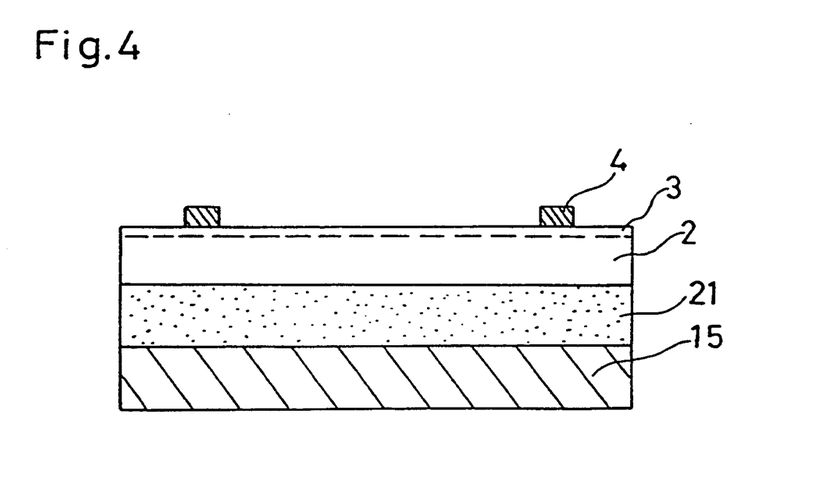
FIG. 4 is a sectional view of a thin-film solar cell in accordance with a second embodiment of the present invention.

FIG. 4 is a cross-sectional view of a thin-film solar cell in accordance with a second embodiment of the present invention. In FIG. 4, reference numeral 15 designates a base substrate comprising stainless steel, glass, alumina, carbon, aluminum, or the like. A film 21 is formed on the base substrate 15 by the plasma coating method. The film 21 is hereinafter referred to as a plasma coating film. A polycrystalline Si thin-film active layer 2 is disposed on the plasma coating film 21. A p-n junction 3 is formed in a surface region of the active layer 2 by diffusion or the like. An upper electrode 4 is disposed on the active layer 2 having the p-n junction 3.

In the above-described first embodiment, the whole substrate 1 is formed by plasma coating. That is, the source material is sprayed onto the base plate 11 to form a layer and then the layer is removed from the base plate to obtain the substrate 1. In this second embodiment, however, the base substrate 15 and the plasma coating film 21 formed on the base substrate 15 are used as a substrate.

More specifically, the plasma coating film 21 is formed on the surface of the base substrate 15 using the plasma coating apparatus of FIG. 2. In this case, since the base substrate 15 mechanically supports the plasma coating film 21, the plasma coating film 21 need not support itself and, therefore, it may be thin. As the result, the plasma coating process is simplified. In addition, production of the solar cell shown in FIG. 1 in which the substrate 1 is formed by plasma coating includes a step of removing the substrate 1 from the base plate 11. In this second embodiment using the support plate 15, however, the removal step can be dispensed with, thereby simplifying the production process.

Figure 5:
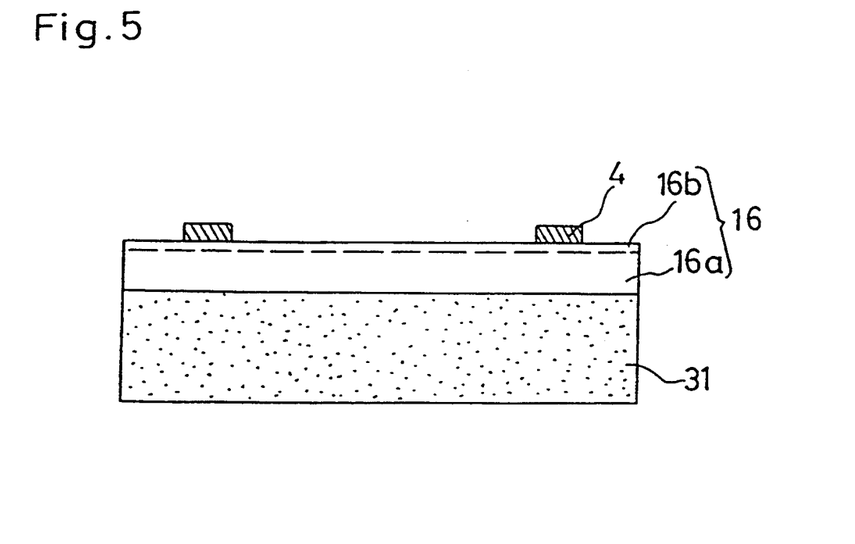
FIG. 5 is a sectional view of a thin-film solar cell in accordance with a third embodiment of the present invention.

FIG. 5 is a cross-sectional view of a thin-film solar cell in accordance with a third embodiment of the present invention. In this third embodiment, a p-n junction layer 16 is formed by plasma coating.

A description is given of a method of producing the thin-film solar cell of FIG. 5. Initially, p-doped Si particles are applied to a substrate 31 comprising stainless steel, glass, alumina, carbon, aluminum, or the like using the plasma coating apparatus of FIG. 2 to form a p type layer 16a of an active region of a solar cell. Then, n-doped Si particles are applied to the p type layer 16a to form an n type layer 16b, producing a p-n junction between the p type layer 16a and the n type layer 16b. Alternatively, the p type and n type layers may be formed employing non-doped Si particles as a source material and introducing p type or n type dopant gas into the ambient during the plasma coating. In addition, a substrate formed by the plasma coating method of the first or second embodiment may be used as the substrate 31.

Figures 8A, 8B:
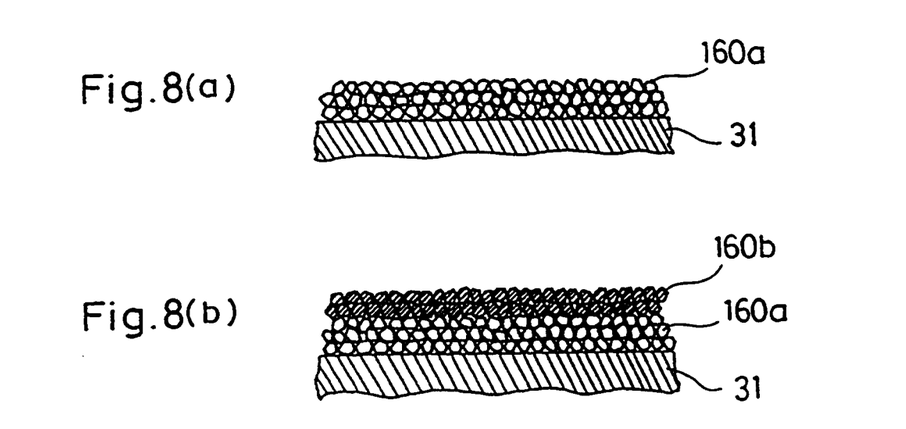
FIGS. 8(a) and 8(b) are diagrams illustrating another method of producing the p-n junction of the thin-film solar cell in accordance with the third and fourth embodiments of the present invention.

When using doped Si particles, p-doped Si particles 160a are applied onto the substrate 31 as shown in FIG. 8(a), and then n-doped Si particles 160b are applied to the p-doped Si particles as shown in FIG. 8(b), whereby the p-n junction is produced. Preferably, boron (B) is used as the p type dopant and phosphorus (P) or antimony (Sb) is used as the n type dopant, and are incorporated into the Si particles to a concentration of $10^{15} \sim 10^{20}$ cm$^-$. In this method, the depth of the p-n junction is controlled by varying the diameter of the n type Si particle in a range of 0.1 to 100 microns or by varying the thickness of the n type film deposited.

Figure 7:
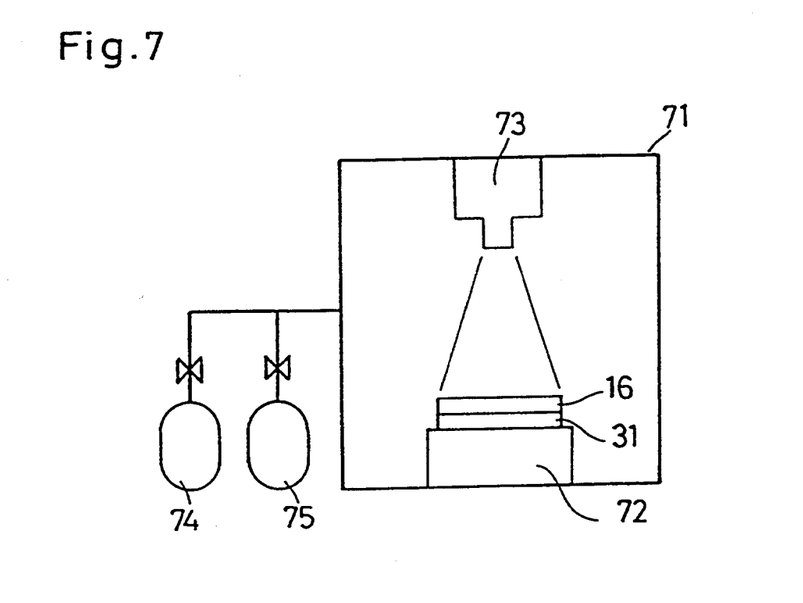
FIG. 7 is a diagram illustrating a method of producing a p-n junction of the thin-film solar cell in accordance with the third and fourth embodiments of the present invention.

FIG. 7 is a schematic diagram illustrating, in more detail, the method of producing the p-n junction using non-doped Si particles and dopant gases. In FIG. 7, a plasma coating apparatus 73 and a susceptor 72 on which a substrate 31 is put are included in a chamber 71. A p type dopant gas supply 74 and an n type dopant gas supply 75 are connected to the chamber 71. As shown in FIG. 7, the non-doped Si particles are applied to the substrate 31 in the chamber 71. Firstly, a p type dopant gas is introduced into the chamber from the p type dopant gas supply 74 and then it is switched to an n type dopant gas from the n type dopant gas supply 75, whereby the p-n junction is produced. Preferably, $B_2H_6$ is used as the p type dopant source gas and $PH_3$ is used as the n type dopant source gas.

The conventional method of producing a p-n junction employing diffusion or the like takes about an hour. In the above-described plasma coating method, however, a p-n junction is produced within 1~10 seconds, which means that the time for producing a thin-film solar cell is significantly reduced.

Figure 6:
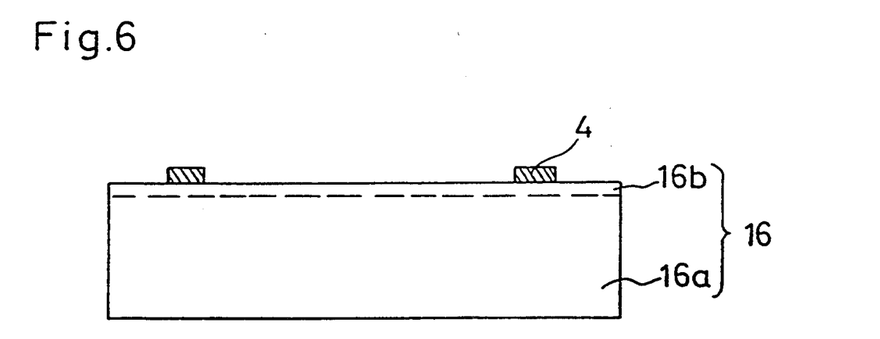
FIG. 6 is a sectional view of a thin-film solar cell in accordance with a fourth embodiment of the present invention.

FIG. 6 is a cross-sectional view of a thin-film solar cell according to a fourth embodiment of the present invention. While in the third embodiment shown in FIG. 5 the junction layer 16 is formed on the support substrate 31, in this fourth embodiment a p type layer 16a is formed so thick that it can support itself, whereby the substrate 31 can be dispensed with.

While in the above-described third and fourth embodiments the p-n Junction is produced by depositing the n type layer on the p type layer, the p-n junction may be produced by forming a p type layer and then diffusing an n type dopant from the surface of the p type layer. Although the time for producing the p-n junction is not reduced in this case, the time for producing the active layer is reduced as compared with the CVD method or the like.

When a semiconductor substrate is formed on a base plate by the plasma coating method, it unfavorably warps during or after the plasma coating process. In the worst case, it is broken. Therefore, when a semiconductor substrate is used without a base plate, only a warped or broken substrate about 3 cm square is produced. On the other hand, when a substrate adhered to a base plate is used, the maximum size of the substrate available is about 8 cm square and it is difficult to obtain a larger one.

A fifth embodiment of the present invention is directed to solving the above-described problems. In this embodiment, a large-size (larger than 10 cm square) semiconductor substrate which is not warped or broken without a base substrate is achieved by the plasma coating method.

Figure 9A:
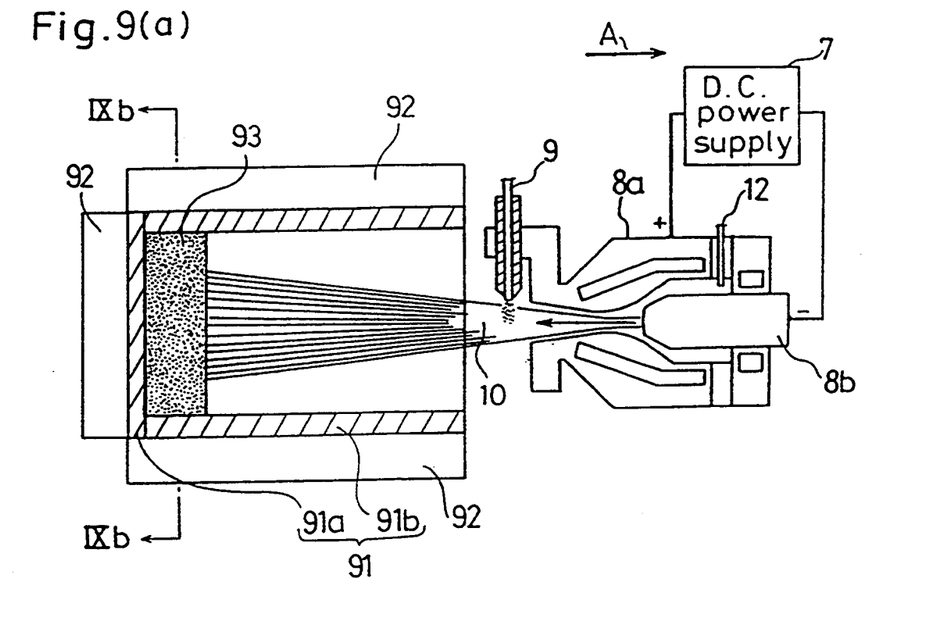
FIGS. 9(a) and 9(b) are diagrams illustrating a method of producing a support substrate in accordance with a sixth embodiment of the present invention.
Figure 9B:
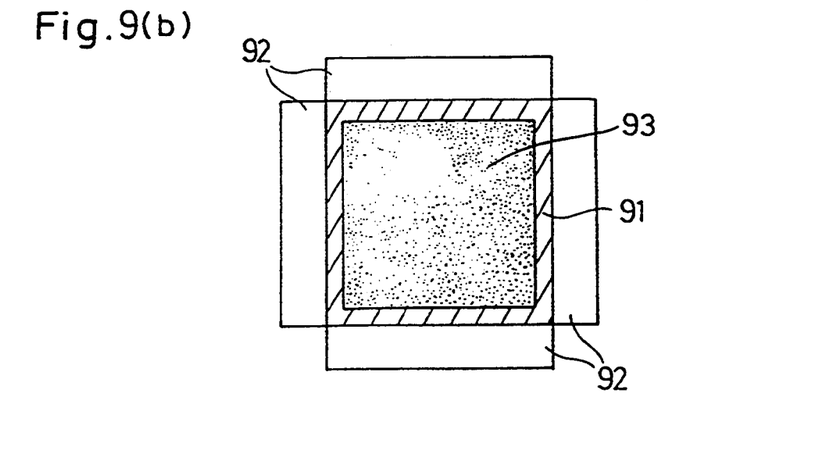

FIGS. 9(a) and 9(b) are schematic diagrams illustrating a method of producing a semiconductor substrate or a semiconductor ingot in accordance with a fifth embodiment of the present invention. In FIGS. 9(a) and 9(b), reference numeral 91 designates a box-shaped base substrate, i.e., a mold, comprising stainless steel or the like and having a bottom part 91a and side walls 91b. The mold 91 is surrounded by a water-cooling or air-cooling apparatus 92. The plasma coating apparatus of this embodiment is identical to that shown in FIG. 2. In FIG. 9(a), the same reference numerals as in FIG. 2 designate the same or corresponding parts. Reference numeral 93 designates MG-Si sprayed into the mold 91 and solidified. In this embodiment, the mold 91 is fixed and a gun of the plasma coating apparatus moves in a direction shown by an arrow A so that the distance between the gun and the coating surface is kept constant during the coating process. FIG. 9(b) is a cross section taken along a line IXb—IXb of FIG. 9(a). As shown in FIG. 9(b), the bottom part of the mold 91 is square in shape and each edge of the square is about 10 cm.

When the gun of the plasma coating apparatus scans an area of about 10 cm square, MG-Si particles are evenly applied onto the area. The scanning is carried out repeatedly until the mold 91 is filled with the MG-Si. The distance between the gun and the coating surface is about 10 cm and kept constant during the coating process by slowly moving the coating apparatus in the direction shown by the arrow A. Since the mold 91 is cooled by a water-cooling or air-cooling apparatus 92, the MG-Si particles sprayed into the mold 91 are rapidly solidified, and the mold itself is not melted by the heat of the high-temperature plasma. In addition, the internal surface of the mold 91 is smooth, like a mirror, so that the MG-Si 93 is easily taken out of the mold after the coating process. The MG-Si taken out of the mold is a rectangular parallelepiped ingot 200 shown in FIG. 11(a). This ingot 200 is sliced in an appropriate thickness, providing a substrate 201 for a thin-film solar cell or the like.

Figure 11A:
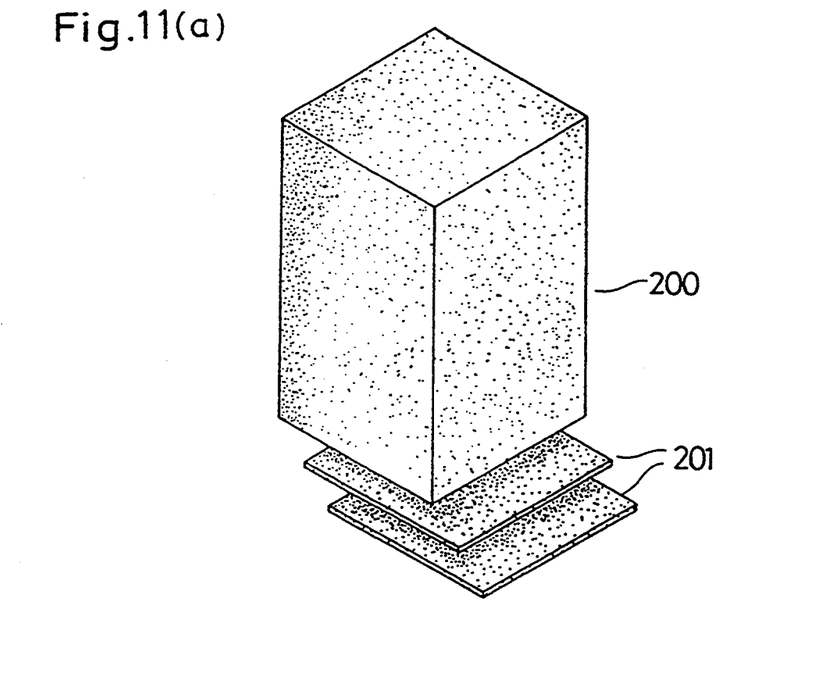
FIGS. 11(a) and 11(b) are perspective views illustrating ingots and substrates produced by the methods of the fifth and the sixth embodiments, respectively.

In this fifth embodiment, the source material fills the box-shaped mold 91 by the plasma coating method to form the ingot 200 and then the ingot is cut in slices to form the substrate 201. Therefore, the problems of warping and cracking are avoided, resulting in a large-sized substrate with no warping.

Figure 11B:
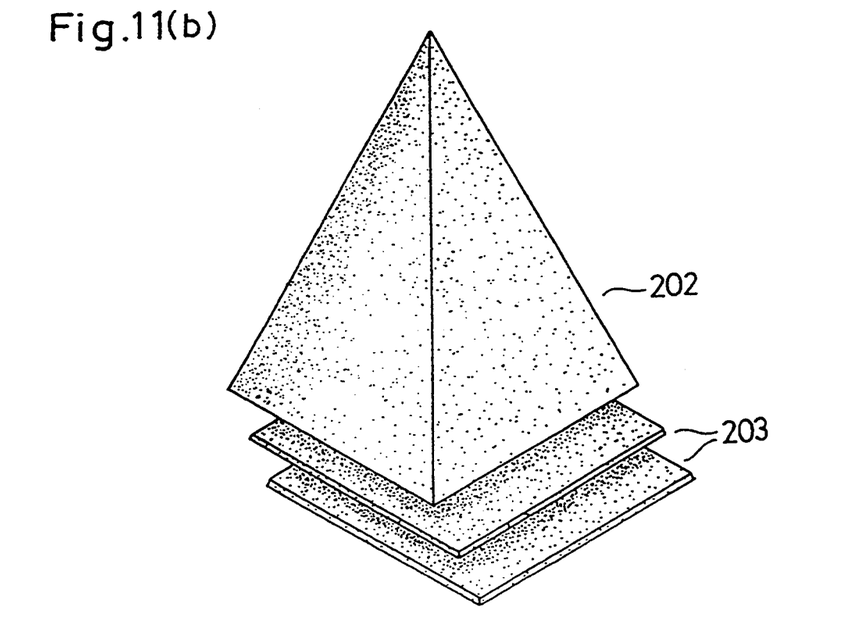

In the above-described fifth embodiment, the bottom surface of the mold 91, which is opposite the source material emitting nozzle of the plasma coating apparatus, is square, but it may be circular, rectangular, or the like according to a shape of a desired substrate. In addition, although the bottom surface of the mold 91 is flat in the fifth embodiment, the internal shape of the mold may be a circular cone, tetrahedron, or the like. If the internal shape of the mold is a tetrahedron, an ingot 202 and a substrate 203 shown in FIG. 11(b) are obtained.

Furthermore, although the size of the bottom surface of the mold 91 is about 10 cm square in the fifth embodiment, a uniform coating of a larger area is possible by controlling the coating conditions, whereby a larger-sized substrate is achieved.

Figure 10:
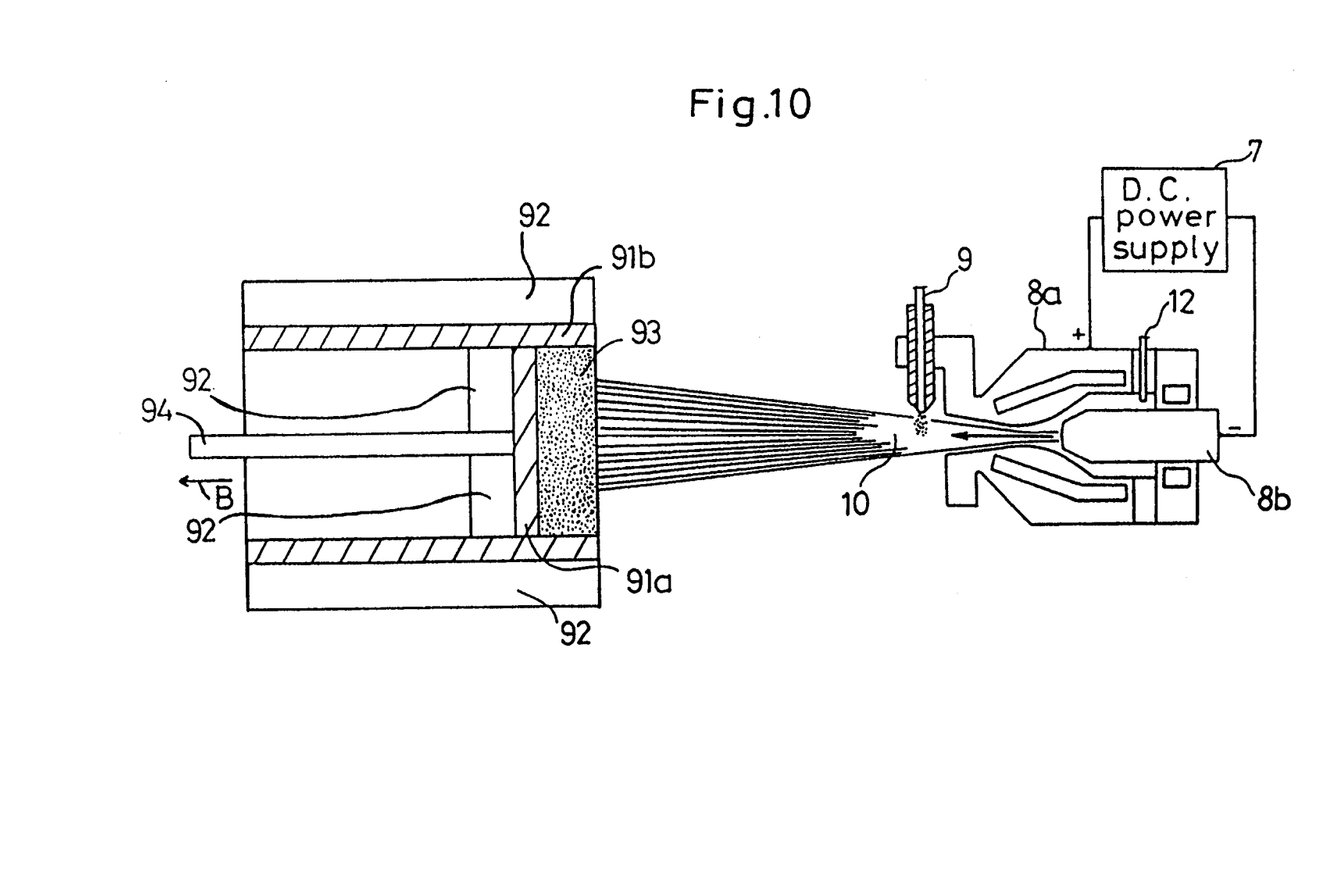
FIG. 10 is a diagram illustrating a method of producing a support substrate in accordance with a seventh embodiment of the present invention.

FIG. 10 is a schematic diagram for explaining a method of producing a semiconductor substrate or ingot according to a sixth embodiment of the present invention. In this sixth embodiment, the bottom part 91a of the mold 91 moves to maintain a constant distance between the gun of the plasma coating apparatus and coating surface. More specifically, a bar 94 fastened to the bottom part 91a of the mold 91 slowly moves in the direction shown by an arrow B according to the thickness of the coated MG-Si, so that the surface of the MG-Si is always at the same distance from the gun of the plasma coating apparatus. Also in this sixth embodiment, the rectangular parallelepiped MG-Si ingot 200 shown in FIG. 11(a) is taken out of the mold 91. This ingot 200 is sliced in an appropriate thickness to obtain the substrate 201 for a thin-film solar cell or the like.

While in the above-described fifth and sixth embodiments the MG-Si ingot is formed by the plasma coating method and then it is cut into a plate to obtain a substrate with no warping, a substrate with no warping can be formed by filling the source material in a mold having a shape of a desired substrate itself and taking the substrate out of the mold.

Figure 12A:
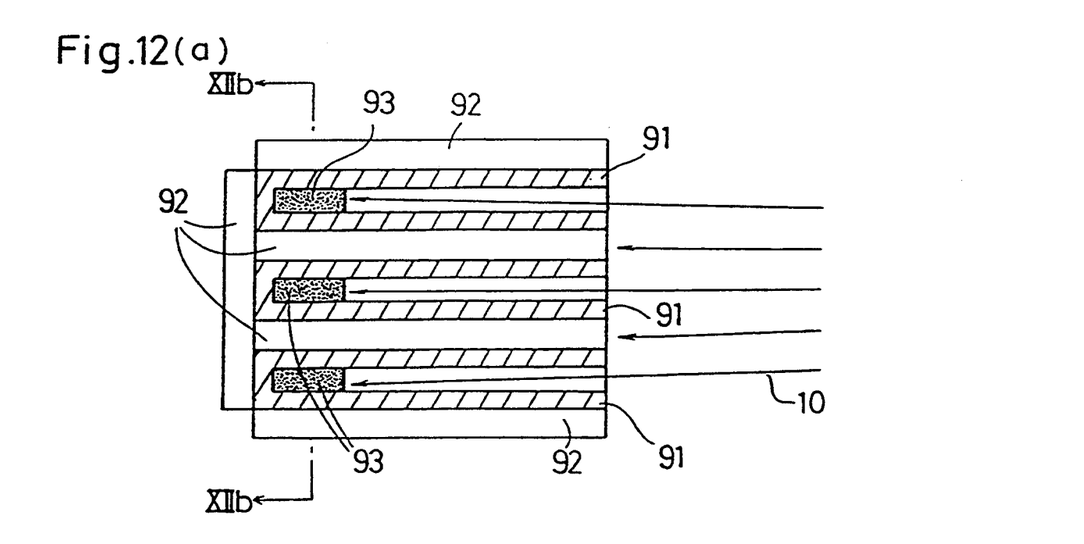
FIGS. 12(a) and 12(b) are sectional views illustrating a method of producing a support substrate in accordance with a seventh embodiment of the present invention.
Figure 12B:
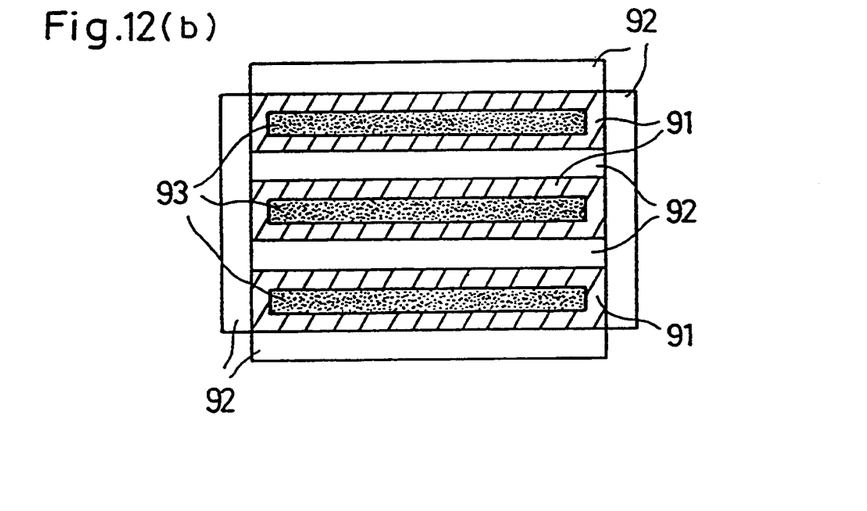

FIGS. 12(a) and 12(b) are schematic diagrams illustrating a method of producing a semiconductor substrate in accordance with a seventh embodiment of the present invention, in FIG. 12(a) is a sectional view in a direction parallel to the direction of the plasma coating and FIG. 12(b) is a sectional view taken along a line XIIb—XIIb of FIG. 12(a). In these figures, the same reference numerals as in FIGS. 9(a) and 9(b) designate the same or corresponding parts.

As a mold having a shape of a desired substrate, a mold obtained by attaching side walls determining a contour of the substrate to the base plate 11 of FIG. 2 is considered. However, it is difficult for this mold to prevent warping of the substrate during or after the plasma coating.

In this seventh embodiment, a mold 91 has a cavity whose internal shape is the same as the shape of a desired substrate and whose opening corresponds to the side surface of the substrate. The source material of the substrate, i.e., MG-Si, is accumulated in the mold not in a thickness direction but in a width direction of the substrate. Therefore, a large-sized substrate with no warping is easily formed. When a plurality of molds 91 are piled up as shown in FIGS. 12(a) and 12(b), a plurality of substrates are formed at the same time. In this embodiment, the mold 91 is fixed and the gun of the plasma coating apparatus (not shown) moves to keep a constant distance between the gun and the coating surface.

Figure 13:
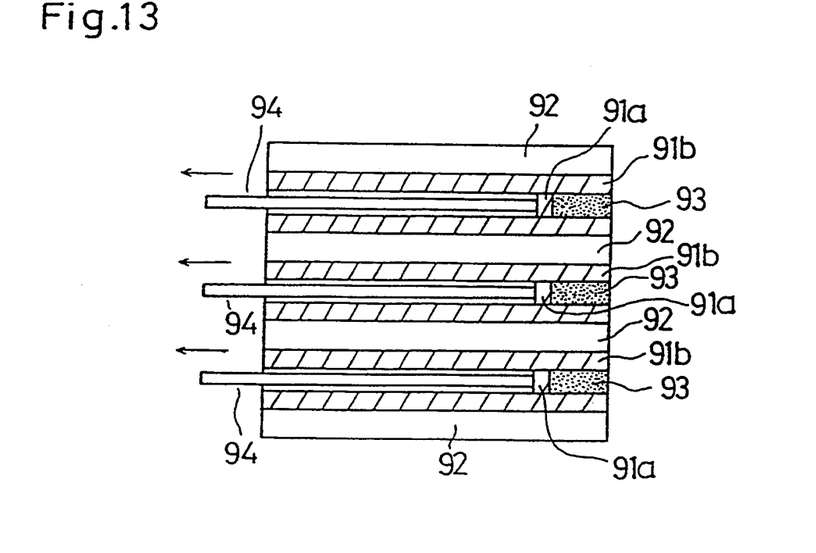
FIG. 13 is a sectional view illustrating a method of producing a semiconductor substrate in accordance with an eighth embodiment of the present invention.

FIG. 13 is a sectional view illustrating a method of producing a semiconductor substrate in accordance with an eighth embodiment of the present invention. In this eighth embodiment, the bottom part 91a of the mold 91 moves in the direction shown by the arrow, whereby the distance between the surface of the coating and the gun of the coating apparatus (not shown) is kept constant.

Figure 14:
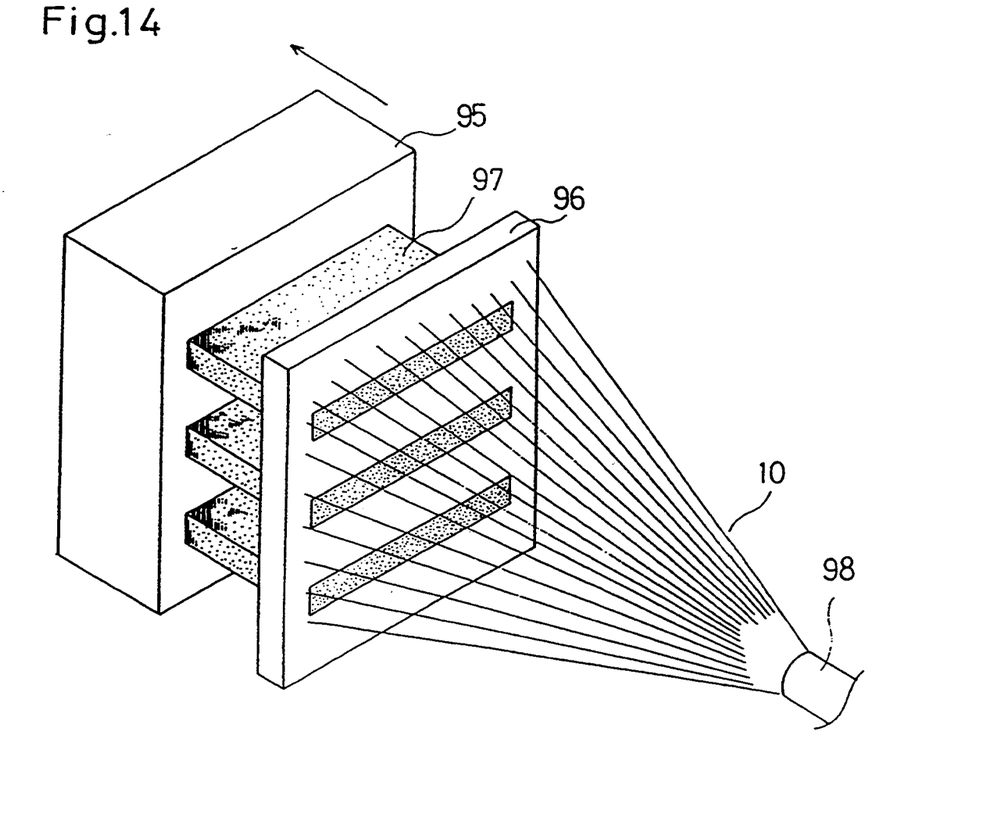
FIG. 14 is a perspective view illustrating a method of producing a semiconductor substrate in accordance with a ninth embodiment of the present invention.

FIG. 14 is a perspective view illustrating a method of producing a semiconductor substrate in accordance with a ninth embodiment of the present invention. In FIG. 14, a semiconductor material is applied to a base substrate 95 through a mask 96 having a plurality of apertures each in a shape of a side surface of a desired semiconductor substrate, whereby a plurality of semiconductor substrates 97 are formed between the mask 96 and the base substrate 95. The distance between the source material emitting nozzle 98 of the plasma coating apparatus and the mask 96 is kept constant. The base substrate 95 slowly moves in the direction shown by the arrow during the coating process, so that the accumulation of the source material is always carried out on the surface of the mask 96. Since the surface of the mask 96 opposite to the nozzle 98 is smooth as a mirror, the source material is not accumulated thereon. The mask 96 and the substrate 95 are cooled by air-cooling or water-cooling means (not shown).

While in the above-described fifth to ninth embodiments MG-Si is used as a source material of the ingot or substrate, any material may be used so long as a substrate formed of the material can be used as a substrate of a semiconductor device.

While in the above-described first to ninth embodiments the plasma coating method is employed, other coating methods, such as a coating method using an arc, may be used. However, the plasma coating method has an advantage over other methods because it is carried out in the air.

As is evident from the foregoing description, according to the present invention, a thin-film solar cell includes a thin-film active layer disposed on a substrate formed by the plasma coating method. Therefore, even when a cheap material including a lot of impurities is used for the substrate, the impurities never sprout from the substrate breaking through the active layer.

In addition, according to the present invention, an active layer of a solar cell having a p-n junction is formed by a plasma coating method. Therefore, the time for forming the active layer or the p-n junction is significantly reduced.

In addition, according to the present invention, a box-shaped mold is filled with a source material by the plasma coating method to produce an ingot and then the ingot is sliced to obtain a substrate. Therefore, a large-sized substrate with no warping is easily formed.

In addition, according to the present invention, a mold having a cavity whose internal shape is the same as the shape of a desired substrate and whose opening corresponds to a side surface of the substrate is prepared, and a semiconductor material is supplied to the mold from the opening to fill the mold with the material. Therefore, a large-sized substrate with no warping is easily formed.

In addition, according to the present invention, a semiconductor material is applied to a base plate through a mask having an aperture in the shape of a side surface of a desired substrate, whereby a semiconductor substrate is formed between the mask and the base plate. Therefore, a large-sized substrate with no warping is easily formed.

What is claimed is:

1. A method making a thin-film solar cell including a semiconductor thin-film active layer with a p-n junction therein formed on a substrate, comprising:
    forming said substrate by melting a substrate source material in a high-temperature plasma and spraying the melted source material into a cavity of a mold with a high-speed gas jet to form an ingot;
    slicing a said substrate from the ingot;
    forming on said substrate said thin-film active semiconductor layer, the active layer comprising a p-n junction including a p-type region and a n-type region; and
    forming first and second electrical contacts to the p-type and n-type regions, respectively.

2. The method of claim 1 wherein said substrate source material is metallurgical grade silicon.

3. The method of claim 1 wherein the cavity of the mold has a shape that is the same as a desired shape of the substrate.

4. The method of claim 3 wherein said substrate source material is metallurgical grade silicon.

5. A method of making a thin-film solar cell including a semiconductor thin-film active layer with a p-n junction therein formed on a substrate providing mechanical support, including:
    forming said substrate by melting a substrate source material in a high-temperature plasma and spraying the melted source material with a high-speed gas jet onto a base plate through an aperture in a mask, the aperture having a shape that is the same shape as the desired cross-section of said substrate;
    forming on said substrate said thin-film active semiconductor layer, the active layer comprising a p-n junction including a p-type region and an n-type region; and
    forming first and second electrical contacts to the p-type and n-type regions, respectively.

6. The method of claim 5 wherein said substrate source material is metallurgical grade silicon.

7. A method of making a thin-film solar cell including a semiconductor thin-film active layer with a p-n junction therein formed on a substrate, comprising:

forming said substrate by melting a substrate source material in a high-temperature plasma and spraying the melted source material into a cavity of a mold through an opening in the mold with a high-speed gas jet, wherein the cavity of the mold has a shape that is the same shape as the desired shape of said substrate and the opening has a shape that is the same shape as the desired cross-section of the substrate;

forming on said substrate said thin-film active semiconductor layer, the active layer comprising a p-n junction including a p-type region and an n-type region; and forming first and second electrical contacts to the p-type and n-type regions, respectively.

8. The method of claim 7 wherein said substrate source material is metallurgical grade silicon.

* * * * *